(12) United States Patent
Fukunaga

(10) Patent No.: US 7,746,184 B2
(45) Date of Patent: Jun. 29, 2010

(54) BONDING-TYPE SURFACE-MOUNT CRYSTAL OSCILLATOR

(75) Inventor: Masahiro Fukunaga, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 46 days.

(21) Appl. No.: 12/155,847

(22) Filed: Jun. 10, 2008

(65) Prior Publication Data

US 2008/0309418 A1    Dec. 18, 2008

(30) Foreign Application Priority Data

Jun. 12, 2007    (JP) ............................. 2007-154701

(51) Int. Cl.
    *H03B 1/00*    (2006.01)

(52) U.S. Cl. ...................... 331/68; 331/108 C; 331/154; 331/158; 331/116 FE; 331/116 R

(58) Field of Classification Search ................... 331/68, 331/158, 116 FE, 116 R, 108 C, 154
    See application file for complete search history.

(56) References Cited

U.S. PATENT DOCUMENTS

| | | | | |
|---|---|---|---|---|
| 6,819,191 B2 * | 11/2004 | Funahara et al. | ............... | 331/68 |
| 6,882,232 B2 * | 4/2005 | Harima | ........................ | 331/68 |
| 6,967,537 B2 * | 11/2005 | Harima et al. | ................ | 331/68 |
| 6,998,926 B2 * | 2/2006 | Miyazaki et al. | .............. | 331/68 |
| 2007/0120614 A1 * | 5/2007 | Moriya et al. | ................ | 331/158 |

FOREIGN PATENT DOCUMENTS

| | | |
|---|---|---|
| JP | 10-098151 | 4/1998 |
| JP | 2001-007647 | 1/2001 |

* cited by examiner

*Primary Examiner*—Arnold Kinkead
*Assistant Examiner*—Richard Tan
(74) *Attorney, Agent, or Firm*—Fitch, Even, Tabin & Flannery

(57) ABSTRACT

A crystal oscillator has: a crystal unit having a container body in which a crystal blank is housed and hermetically sealed; and a mounting substrate that houses an IC chip having at least an integrated oscillating circuit that uses the crystal unit. External terminals are formed as protrusions at four corners of the outer bottom surface of the container body, and depressions corresponding to the external terminals are formed at four corners of the top surface of the mounting substrate. Bonding terminals are formed at the inner bottom surface of the depressions. The mounting substrate is electrically and mechanically bonded to the outer bottom surface of the crystal unit by fitting the external terminals into the depressions and bonding the external terminals to the corresponding bonding terminals by soldering.

10 Claims, 4 Drawing Sheets

BONDING-TYPE SURFACE-MOUNT CRYSTAL OSCILLATOR

CROSS-REFERENCE TO RELATED APPLICATION

This application claims the benefit of foreign priority under 35 U.S.C. §119 based on JP 2007-154701, filed Jun. 12, 2007, the entire disclosure of which is hereby incorporated by reference herein.

BACKGROUND OF THE INVENTION

1. Field of the Invention

The present invention relates to a bonding-type surface-mount crystal oscillator that has a quartz crystal unit and a mounting substrate bonded to the bottom surface of the crystal unit, the mounting substrate housing an integrated circuit (IC) chip. In particular, it relates to a surface-mount crystal oscillator that prevents occurrence of horizontal misalignment between the mounting substrate and the crystal unit.

2. Description of the Related Arts

Surface-mount crystal oscillators, which integrally incorporate a quartz crystal unit and an IC chip having an oscillating circuit that uses the crystal unit, are small and light-weight and thus widely used as a frequency or time reference for a portable electronic apparatus including cellular phones. One example of the surface-mount crystal oscillators is the bonding type, which comprises: a crystal unit having a crystal blank hermetically sealed in a container; and a mounting substrate housing an IC chip and bonded to the bottom surface of the crystal unit. Typically, the mounting substrate is bonded to the crystal unit by soldering.

FIG. 1A is a cross-sectional view of a conventional bonding-type surface-mount crystal oscillator. FIG. 1B is a bottom view of a crystal unit used in the crystal oscillator. FIG. 1C is a top view of a mounting substrate.

The crystal oscillator shown has quartz crystal unit 1 and mounting substrate 2, which have the same horizontal outer dimensions. Crystal unit 1 has container body 3 having a recess and having the shape of a substantially rectangular parallelepiped. Crystal blank 4 is housed in the recess, and the recess is closed by metal cover 5, thereby hermetically sealing crystal blank 4 in container body 3. Container body 3 is made of laminated ceramics. On the inner bottom surface of the recess of container body 3, a pair of crystal holding terminals (not shown) are provided. At each of the four corners of the outer bottom surface of container body 3, external terminal 6 used for bonding mounting substrate 2 to crystal unit 1 is provided.

Crystal blank 4 is a substantially rectangular AT-cut quartz crystal blank, for example. An excitation electrode (not shown) is provided on each of the opposite principal surfaces of crystal blank 4, and leading electrodes extend from the respective excitation electrodes to the opposite sides of one end of crystal blank 4. The opposite sides of one end of crystal blank 4, to which the leading electrodes extend from the excitation electrodes, are secured by conductive adhesive 12 to the crystal holding terminals on the inner bottom surface of the recess of container body 3, and thus crystal blank 4 is held in the horizontal position in the recess as shown. The crystal holding terminals are electrically connected to two of four external terminals 6 on the outer bottom surface of container body 3 that are located at a pair of diagonal corners of the outer bottom surface via a conductive path formed on container body 3. The conductive path is formed on the lamination plane of the laminated ceramics and the outer side surface of container body 3.

The edges between every two adjacent surfaces of the four outer side surfaces of container body 3 are formed as arch-shaped chamfered portion 7 by through-hole processing. End-face electrodes 6a, on which a solder fillet is formed when mounting substrate 2 is bonded to crystal unit 1 by soldering, are formed on chamfered portions 7, that is, the through-hole-processed surfaces.

Metal cover 5 is bonded to the surface around the opening of the recess of container body 3 by seam welding or the like. Of external terminals 6 of container body 3, external terminals that are not connected to the crystal holding terminals are electrically connected to metal cover 5 via a through hole formed in container body 3 or the like.

In crystal unit 1, external terminals 6, the crystal holding terminals and end-face electrodes 6a are formed as electrode layers having a thickness about 5 μm and made of a base layer of tungsten (W) or the like plated with nickel (Ni) or gold (Au).

Mounting substrate 2 is made of laminated ceramics and has a substantially rectangular planar shape. Mounting substrate 2 has recess 2a for housing IC chip 8 in one principal surface, or specifically the top surface, thereof. At the four corners of the outer bottom surface, that is, the other principal surface, of mounting substrate 2, there are provided mounting terminals 9 that are used when the crystal oscillator is surface-mounted on a wiring board of a cellular phone or the like. Mounting terminals 9 include a power supply terminal, an output terminal and a ground terminal. At the four corners of the one principal surface of mounting substrate 2, that is, the four corners of the surface surrounding the opening of recess 2a, bonding terminals 10 are provided to correspond to external terminals 6 on crystal unit 1. Mounting terminals 9 and bonding terminals 10 are electrically connected to circuit terminals (not shown) formed on the inner bottom surface of recess 2a via a conductive path formed on mounting substrate 2.

IC chip 8 has a substantially rectangular shape and has at least an oscillating circuit that uses crystal unit 1 and that is integrated with a semiconductor substrate. Of the opposite principal surfaces of IC chip 8, the surface on which an electronic circuit, such as the oscillating circuit on the semiconductor substrate, is formed is refereed to as a circuit-forming surface. On the circuit-forming surface, a plurality of IC terminals for connecting IC chip 8 to an external circuit are formed. IC chip 8 is bonded to the bottom surface of recess 2a of mounting substrate 2 with the circuit-forming surface facing the bottom surface of recess 2a by bonding the IC terminals to the circuit terminals on the bottom surface of recess 2a by flip-chip bonding, such as ultrasonic thermocompression bonding. As a result, the electronic circuit in IC chip 8 is electrically connected to mounting terminals 9 and bonding terminals 10 via the circuit terminals. In mounting substrate 2, the circuit terminals, mounting terminals 9 and bonding terminals 10 are formed as electrode layers having a thickness about 5 μm and made of a base layer of tungsten (W) or the like plated with nickel (Ni) and gold (Au).

Cream solder 11 is applied to bonding terminals 10 on the top surface of mounting substrate 2 and external terminals 6 on the bottom surface of crystal unit 1, bonding terminals 10 and external terminals 6 are brought into intimate contact with each other, and reflow soldering is conducted by heating mounting substrate 2 and crystal unit 1 in a high-temperature furnace and then cooling the same, thereby bonding mounting substrate 2 housing the IC chip and crystal unit 1 to each other, thereby completing the crystal oscillator. The completed crystal oscillator is then mounted on a wiring board by reflow soldering.

However, the above-described crystal oscillator in which crystal unit 1 and mounting substrate 2 are bonded by soldering has a problem that, when the crystal oscillator is mounted on a wiring board by reflow soldering, solder 11 bonding crystal unit 1 and mounting substrate 2 can also be molten by the heat, thereby causing misalignment of crystal unit 1 with mounting substrate 2 particularly in the horizontal direction.

As a solution to the problem, Japanese Patent Laid-Open Nos. 10-98151 and 2001-7647 (JP-A-10-098151 and JP-A-2001-007647) disclose an arrangement in which the mounting substrate and the crystal unit are bonded to each other by an insulating adhesive in addition to being electrically bonded to each other by soldering. However, this arrangement requires a step of applying the insulating adhesive and the like, and therefore, the manufacturing process becomes complicated.

SUMMARY OF THE INVENTION

An object of the present invention is to provide a bonding-type surface-mount crystal oscillator that is capable of preventing occurrence of misalignment between a crystal unit and a mounting substrate without using an insulating adhesive or the like.

The object of the present invention is achieved by a crystal oscillator, comprising: a crystal unit having a container body in which a crystal blank is housed and hermetically sealed, the container body having external terminals at four corners of an outer bottom surface thereof; and a mounting substrate that houses an IC chip having at least an integrated oscillating circuit that uses the crystal unit, the mounting substrate having bonding terminals corresponding to the external terminals at four corners of a top surface of the mounting substrate, wherein at least the external terminals of the crystal unit that are located at a pair of diagonal corners of the crystal unit are formed as protrusions, and the bonding terminals corresponding to the external terminals formed as protrusions are disposed in depressions formed in the top surface of the mounting substrate, and the mounting substrate is electrically and mechanically bonded to the outer bottom surface of the crystal unit by fitting the protrusions into the depressions and bonding the external terminals to the corresponding bonding terminals by soldering.

In the crystal oscillator according to the present invention, instead of forming the external terminals as protrusions and disposing the bonding terminals in the depressions, at least the bonding terminals located at a pair of diagonal corners of the mounting substrate can be formed as protrusions, and the external terminals corresponding to the bonding terminals formed as protrusions can be disposed in depressions formed in the outer bottom surface of the container body.

Such a configuration prevents misalignment of the crystal unit with the mounting substrate particularly in the horizontal direction even if the solder that bonds the crystal unit and the mounting substrate to each other is molten when the crystal oscillator is surface-mounted on a wiring board by reflow soldering, because the crystal unit and the mounting substrate are fixedly positioned by fitting the protrusions into the depressions. Here, the protrusions located at only one pair of diagonal corners can be fitted into the corresponding depressions, or the protrusions located at the both pairs of diagonal corners can be fitted into the corresponding depressions.

According to the present invention, each of the depressions may have a portion of a peripheral wall thereof removed and open outwardly from the outer side surface of the mounting substrate or the container body. For example, the depression may have a rectangular planar shape and open outwardly from the outer side surfaces of the mounting substrate in two directions. If the depressions open outwardly from the outer side surface of the mounting substrate or the container body in this way, the solder climbs along the outer side surface to form a solder fillet during reflow soldering, so that whether or not the soldering is properly achieved can be easily determined.

DETAILED DESCRIPTION OF THE PREFERRED EMBODIMENT

Figure 1A:
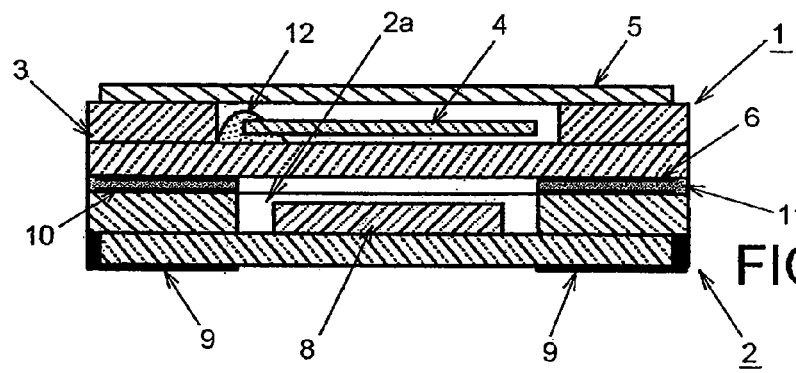
FIG. 1A is a cross-sectional view of a conventional bonding-type surface-mount crystal oscillator.
Figure 1B:
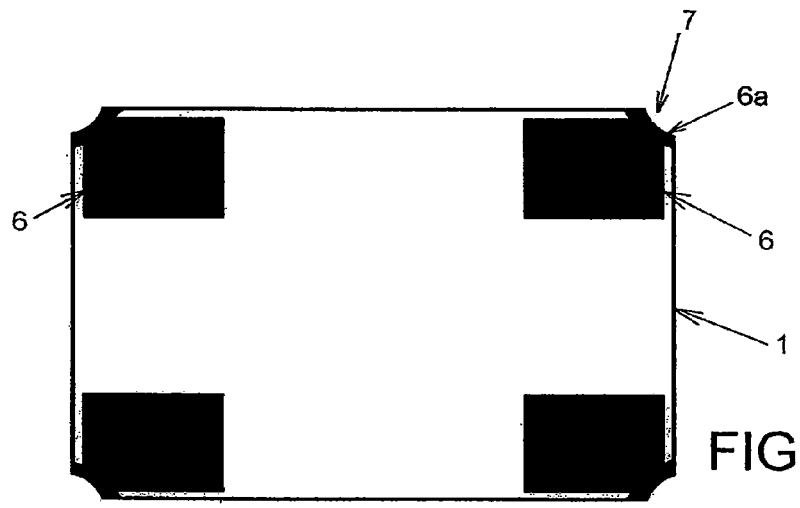
FIG. 1B is a bottom view of a crystal unit used in the crystal oscillator shown in FIG. 1A.
Figure 1C:
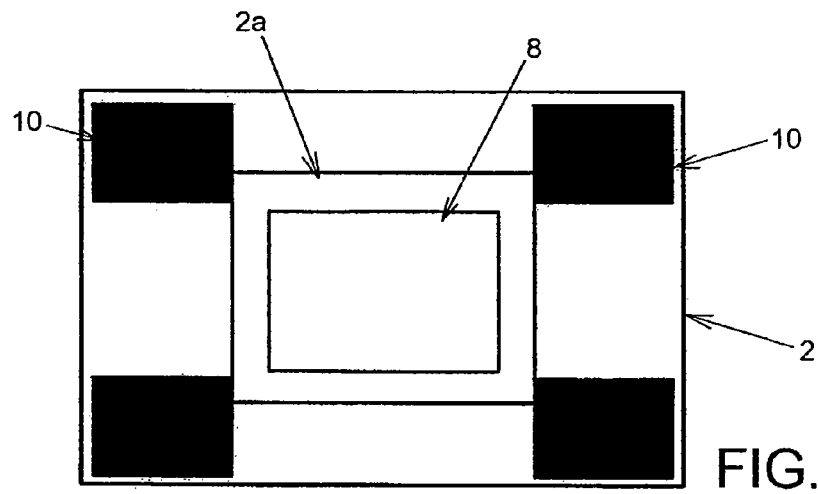
FIG. 1C is a top view of a mounting substrate used in the crystal oscillator shown in FIG. 1A.
Figure 2A:
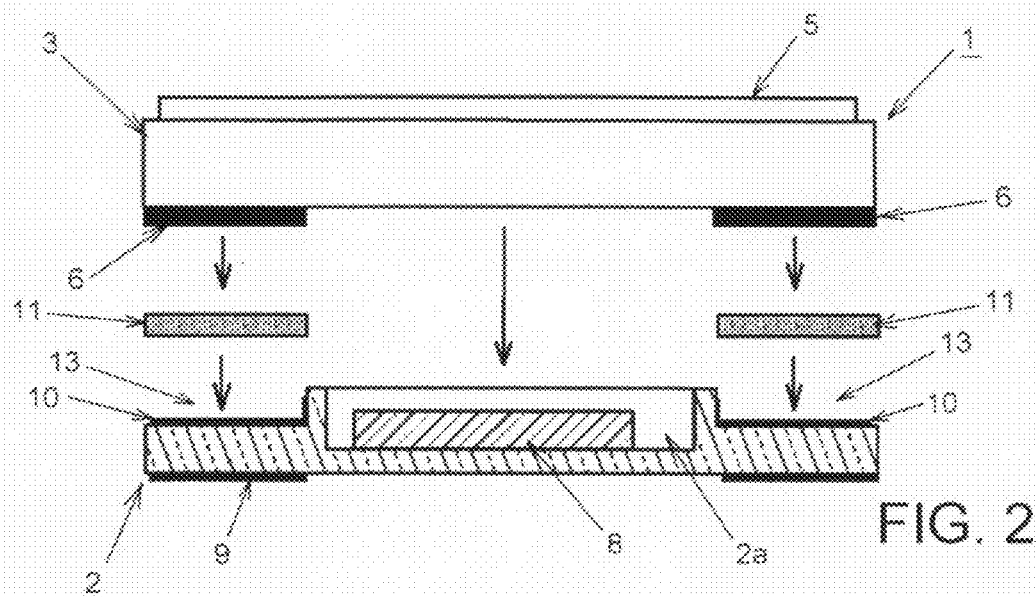
FIG. 2A is an assembly cross-sectional view of a bonding-type surface-mount crystal oscillator according to an embodiment of the present invention.
Figure 2B:
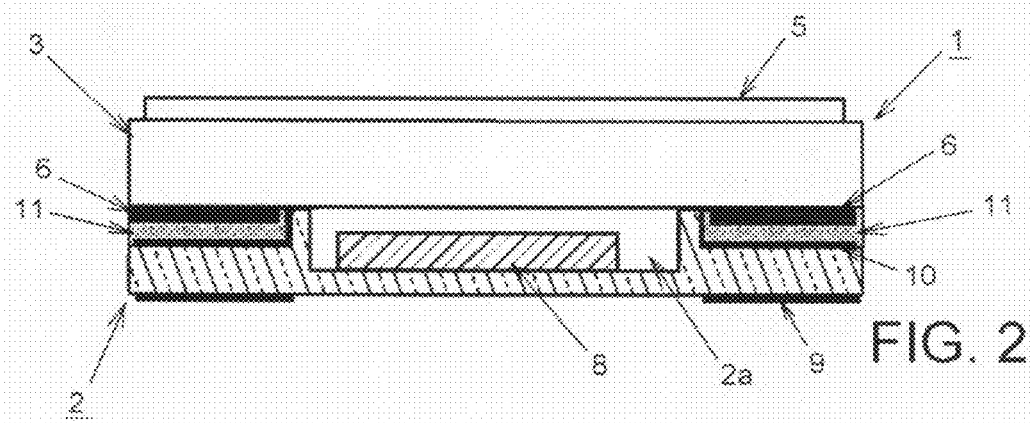
FIG. 2B is a cross-sectional view of the crystal oscillator shown in FIG. 2A.
Figure 2C:
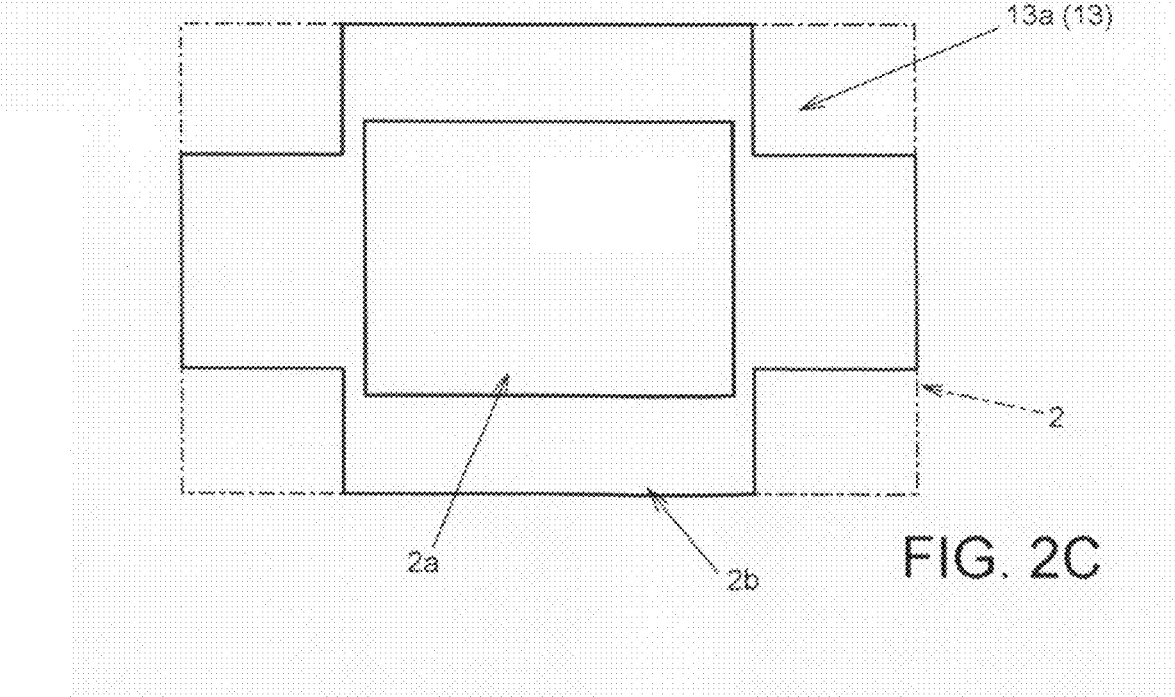
FIG. 2C is a top view of a uppermost layer of a mounting substrate used in the crystal oscillator shown in FIG. 2A.

In FIGS. 2A to 2C showing a bonding-type surface-mount crystal oscillator according an embodiment of the present invention, the same components as those shown in FIGS. 1A to 1C are denoted by the same reference numerals, and redundant description thereof will be omitted or simplified.

The surface-mount crystal oscillator of the present embodiment is the same as the surface-mount crystal oscillator described earlier and has quartz crystal unit 1 and mounting substrate 2, which have the same horizontal outer dimensions. Crystal unit 1 has the shape of a substantially rectangular parallelepiped and has crystal blank 4 hermetically sealed in container body 3. Mounting substrate 2 has recess 2a formed in one principal surface thereof and IC chip 8, which is an integrated oscillating circuit, housed in recess 2a. External terminals 6 of crystal unit 1 and bonding terminals 10 of mounting substrate 2 are bonded to each other by solder 11, thereby bonding mounting substrate 2 to the bottom surface of crystal unit 1 with the surface in which the opening of recess 2a is formed facing crystal unit 1.

The crystal oscillator according to this embodiment differs from the crystal oscillator shown in FIGS. 1A to 1C in that external terminals 6 formed on the outer bottom surface of container body 3 are thicker and therefore significantly protrude from the outer bottom surface of container body 3.

Accordingly, bonding terminals 10 of mounting substrate 2 are formed in depressions 13 formed in one principal surface of mounting substrate 2.

When container body 3 made of laminated ceramics is formed by stacking and sintering ceramic green sheets, i.e., unburned ceramic sheets, external terminals 6 are formed by disposing a tungsten layer on the ceramic green sheet by printing before the sintering, and plating the tungsten layer with nickel and gold after the sintering. When the tungsten layer is formed on the ceramic sheet, the thickness of external terminals 6 can be increased by multiple applications of tungsten material, for example. In this embodiment, external terminals 6 have a thickness of about 30 to 50 μm. On the other hand, the external terminals of the crystal oscillator shown in FIGS. 1A to 1C, for example, which are formed by a single application of tungsten material, have a thickness of about 5 μm.

Mounting substrate 2 has four depressions 13 that are formed at the four corners of one principal surface thereof to correspond to external terminals 6 of crystal unit 1. When mounting substrate 2 made of laminated ceramics is formed, such depressions 13 are provided by forming outwardly opening notches 13a at the four corners of ceramic green sheet 2b that is to constitute an uppermost layer of the lamination and then stacking and sintering the ceramic green sheets. FIG. 2C shows a shape of ceramic green sheet 2b for the uppermost layer. Each depression 13 has a hook-like planar shape. In other words, each depression 13 has rectangular planar shape and opens outwardly from the outer side surfaces of mounting substrate 2 in two directions.

On the bottom surface and the inner-side surface of each depression 13, bonding terminal 10 is formed by printing or the like. Depression 13 has a depth greater than the thickness of cream solder 11 used for bonding of crystal unit 1 and mounting substrate 2. In this specification, the depth of depression 13 means the depth viewed from one principal surface of mounting substrate 2, that is, the top surface of mounting substrate 2.

When mounting substrate 2 is bonded to the bottom surface of crystal unit 1, external terminals 6 protruding from crystal unit 1 is fitted into depressions 13 formed in mounting substrate 2 with the cream solder interposed therebetween. Then, the solder is made molten by heating to electrically and mechanically bond external terminals 6 and bonding terminals 10 in depressions 13. In this way, the crystal oscillator is completed.

The crystal oscillator thus constructed is surface-mounted on a wiring board by reflow soldering as in the case descried earlier.

The crystal oscillator according to this embodiment can prevent horizontal misalignment of crystal unit 1 with mounting substrate 2 even if solder 11 is molten when the crystal oscillator is mounted on a wiring board by reflow soldering, because protruding external terminals 6 of crystal unit 1 are fitted into depressions 13 formed in mounting substrate 2 so that crystal unit 1 is fixedly positioned with respect to mounting substrate 2.

In this example, since bonding terminal 10 is formed also on the inner side surface of each depression 13, the bonding area between external terminals 6 and bonding terminals 10 increases, and the bonding strength between crystal unit 1 and mounting substrate 2 also increases. In addition, since depressions 13 have a hook-like planar shape and open outwardly from the outer side surface of mounting substrate 2, it is possible to confirm whether or not soldering is properly achieved by checking for climbing of the solder, for example.

While one example of the crystal oscillator according to the present invention has been described above, the present invention is not limited to the example described above.

Figure 3A:
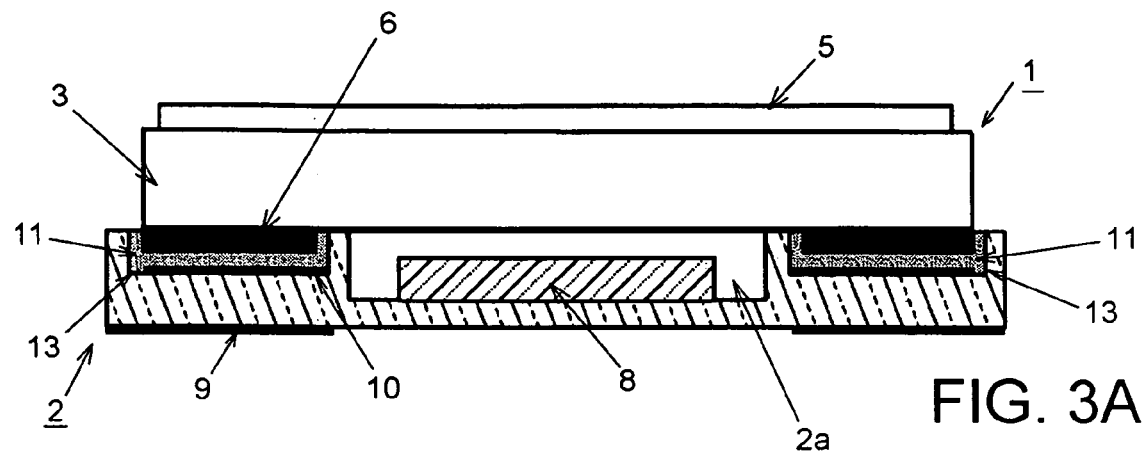
FIG. 3A is a cross-sectional view of another example of the bonding-type surface-mount crystal oscillator according to the present invention.

In the crystal oscillator shown in FIGS. 2A to 2C, each depression 13 has a hook-like planar shape and opens in two directions from the outer side surface of mounting substrate 2. However, as shown in FIG. 3A, depression 13 that has a substantially rectangular hollow shape and a peripheral wall on each side or, in other words, depression 13 that does not open-outwardly from the outer side surface of mounting substrate 2 can be formed. If such a depression is formed, crystal unit 1 and mounting substrate 2 can be positioned with higher reliability. In this arrangement, one of the four sides of each depression having a substantially rectangular shape can open outwardly from the outer side surface of mounting substrate 2.

Figure 3B:
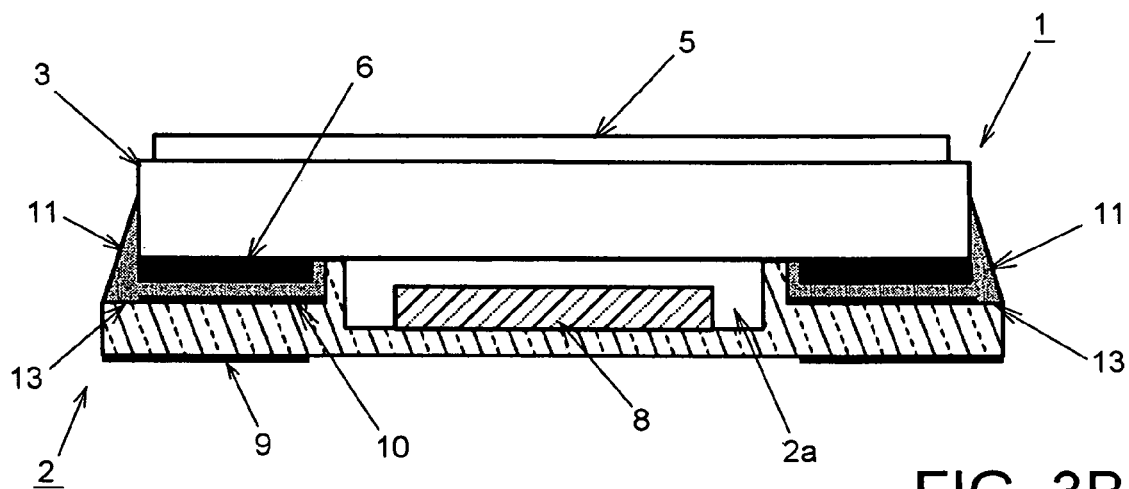
FIG. 3B is a cross-sectional view of another example of the boding-type surface-mount crystal oscillator according to the present invention.

Furthermore, as shown in FIG. 3B, in the arrangement shown in FIGS. 2A to 2C, the horizontal outer dimensions of mounting substrate 2 can be larger than those of crystal unit 1. In that case, during reflow soldering for bonding mounting substrate 2 to crystal unit 1, the solder climbs along the outer side surface of crystal unit 1 to form a solder fillet, so that whether the soldering is properly achieved or not can be easily confirmed.

In the above description, protruding external terminal 6 is formed at each of the four corners of the outer bottom surface of crystal unit 1. However, the protruding external terminals can be formed at only a pair of diagonal corners of the outer bottom surface of a crystal blank. In that case, depressions 13 are formed only at a corresponding pair of diagonal corners of the top surface of mounting substrate 2. Even this configuration can prevent occurrence of misalignment between crystal unit 1 and mounting substrate 2 when the crystal oscillator is surface-mounted on a wiring board.

Figure 4A:
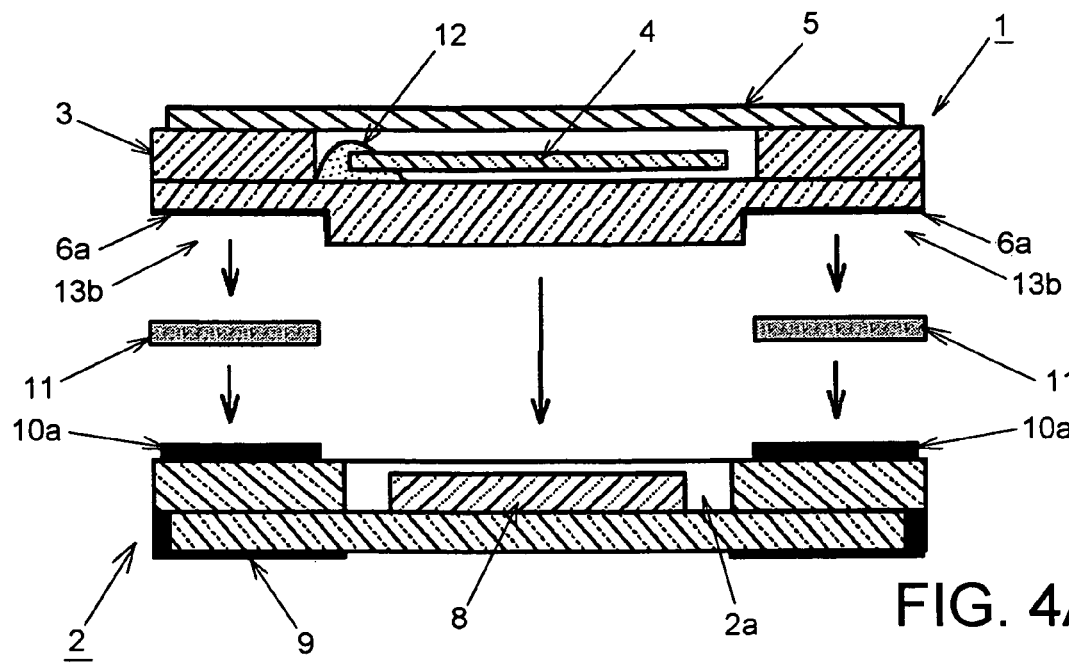
FIG. 4A is an assembly cross-sectional view of another example of the bonding-type surface-mount crystal oscillator according to the present invention.
Figure 4B:
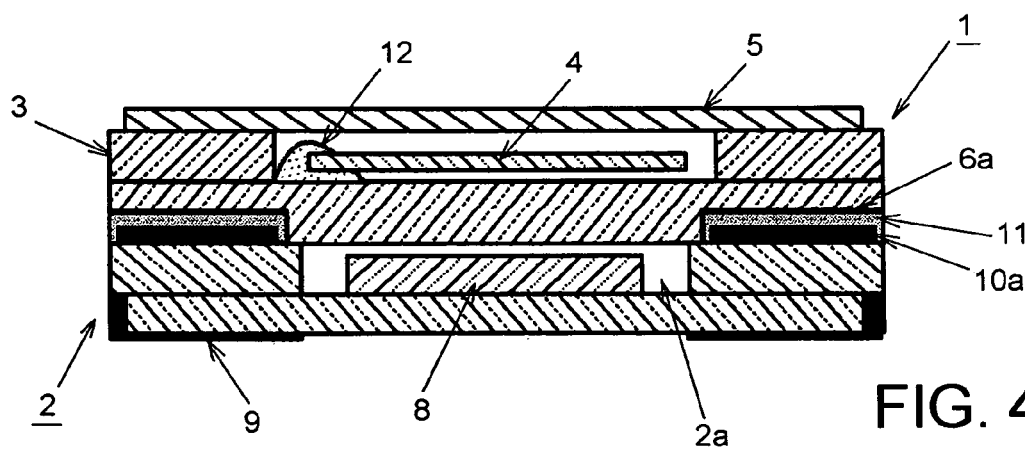
FIG. 4B is a cross-sectional view of the crystal oscillator shown in FIG. 4A.

In the above description, external terminals 6 on crystal unit 1 are formed as protrusions, and depressions 13 are formed in mounting substrate 2, and the bonding terminals are formed in depressions 13. However, the reverse configuration is possible. Specifically, depressions can be formed in the outer bottom surface of crystal unit 1, and the external terminals can be disposed in the depressions, and the bonding terminals on one principal surface of mounting substrate 2 can protrude from the principal surface. FIGS. 4A and 4B show a modification of the surface-mount crystal oscillator shown in FIGS. 2A to 2C in which protruding external terminals 10a are formed on the top bottom surface of mounting substrate 2, depressions 13a are formed on the outer bottom surface of crystal unit 1 and the external terminals 6a are disposed in depressions 13a. In that case also, the protruding bonding terminals are formed at all the four corners or a pair of diagonal corners of the top surface of mounting substrate 2, and the depressions in the outer bottom surface of the crystal unit are formed at positions corresponding to the positions of the protruding bonding terminals.

Figure 4C:
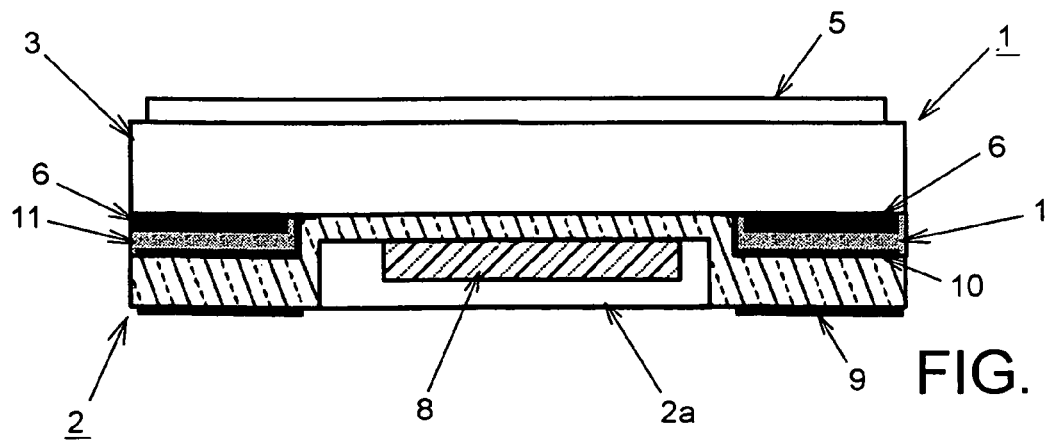
FIG. 4C is a cross-sectional view of another example of the boding-type surface-mount crystal oscillator according to the present invention.

In the above description, of the two principal surfaces of mounting substrate 2, the principal surface having a recess for housing an IC chip is bonded to the outer bottom surface of the crystal unit. Alternatively, the principal surface that does not have the recess can be bonded to the outer bottom surface of crystal unit 1. FIG. 4C shows a modification of the surface-mount crystal oscillator shown in FIGS. 2A to 2C in which a principal surface of mounting substrate 2, which is free from recess 2a for housing IC chip 8, is bonded to the outer bottom surface of crystal unit 1.

What is claimed is:

1. A crystal oscillator, comprising:

a crystal unit having a container body in which a crystal blank is housed and hermetically sealed, said container body having external terminals at four corners of an outer bottom surface thereof; and a mounting substrate that houses an IC chip having at least an integrated oscillating circuit that uses said crystal unit, said mounting substrate having a recess for housing the IC chip, and said mounting substrate having bonding terminals corresponding to said external terminals at four corners of a top surface of the mounting substrate, wherein at least the external terminals of said crystal unit that are located at a pair of diagonal corners of the crystal unit are formed as protrusions from the outer bottom surface, and the bonding terminals corresponding to the external terminals formed as protrusions are disposed in depressions which are formed in the top surface of said mounting substrate separately from the recess to receive the external terminals formed as protrusions, and said mounting substrate is electrically and mechanically bonded to the outer bottom surface of said crystal unit by fitting said protrusions into said depressions and bonding said external terminals to the corresponding bonding terminals by soldering.

2. The crystal oscillator according to claim 1, wherein each of said depressions has a portion of a peripheral wall thereof removed and opens outwardly from the outer side surface of said mounting substrate.

3. The crystal oscillator according to claim 2, wherein each of said depressions has a rectangular planar shape and opens outwardly from the outer side surfaces of said mounting substrate in two directions.

4. The crystal oscillator according to claim 1, wherein said container body and said mounting substrate are made of laminated ceramics.

5. The crystal oscillator according to claim 1, wherein said mounting substrate has a recess for housing said IC chip in one principal surface thereof, and said one principal surface or the other principal surface is bonded to the outer bottom surface of said crystal unit.

6. A crystal oscillator, comprising:

a crystal unit having a container body in which a crystal blank is housed and hermetically sealed, said container body having external terminals at four corners of an outer bottom surface thereof; and a mounting substrate that houses an IC chip having at least an integrated oscillating circuit that uses said crystal unit, said mounting substrate having bonding terminals corresponding to said external terminals at four corners of a top surface of the mounting substrate, wherein at least the bonding terminals of said mounting substrate that are located at a pair of diagonal corners thereof are formed as protrusions from the top surface, and the external terminals corresponding to the bonding terminals formed as protrusions are disposed in depressions formed in the outer bottom surface of said container body to receive the bonding terminals formed as protrusions, and said mounting substrate is electrically and mechanically bonded to the outer bottom surface of said crystal unit by fitting said protrusions into said depressions and bonding said external terminals to the corresponding bonding terminals by soldering.

7. The crystal oscillator according to claim 6, wherein each of said depressions has a portion of a peripheral wall thereof removed and opens outwardly from the outer side surface of said container body.

8. The crystal oscillator according to claim 7, wherein each of said depressions has a rectangular planar shape and opens outwardly from the outer side surfaces of said container body in two directions.

9. The crystal oscillator according to claim 6, wherein said container body and said mounting substrate are made of laminated ceramics.

10. The crystal oscillator according to claim 6, wherein said mounting substrate has a recess for housing said IC chip in one principal surface thereof, and said one principal surface or the other principal surface is bonded to the outer bottom surface of said crystal unit.

* * * * *